United States Patent [19]
Schrader et al.

[11] Patent Number: 5,859,606
[45] Date of Patent: Jan. 12, 1999

[54] INTERPOLATION CIRCUIT FOR DIGITAL-TO-ANALOG CONVERTER

[75] Inventors: Victor Paul Schrader, Oakland; James Lee Brubaker, Santa Cruz, both of Calif.

[73] Assignee: Linear Technology Corporation, Milpitas, Calif.

[21] Appl. No.: 910,482

[22] Filed: Jul. 25, 1997

[51] Int. Cl.[6] .................................................. H03M 1/66
[52] U.S. Cl. .......................................... 341/144; 341/150
[58] Field of Search .................................. 341/144, 141, 341/143, 159, 172, 150

[56] References Cited

U.S. PATENT DOCUMENTS

| | | | |
|---|---|---|---|
| 5,235,334 | 8/1993 | Manvar et al. | 341/143 |
| 5,313,205 | 5/1994 | Wilson | 341/144 |
| 5,396,245 | 3/1995 | Rempfer | 341/145 |

*Primary Examiner*—Brian Young
*Attorney, Agent, or Firm*—Fish & Neave; G. Victor Treyz

[57] ABSTRACT

A voltage interpolation circuit for a digital-to-analog converter comprises a differential amplifier with composite input devices, each of which is composed of multiple active subtransistors. Interpolation is effected between a first voltage and a second voltage by selectively connecting the gates of the active subtransistors in one of the composite devices to either the first voltage or the second voltage. Each active subtransistor operates in conjunction with a voltage-controlled degeneration subtransistor to form a functional subtransistor pair. Using the nonlinear conductance characteristic of MOS devices operated in the triode region, the transconductance of each functional subtransistor pair is modulated in such a way as to be made relatively insensitive to changes in effective gate-to-source voltage $V_{GS}'$, so that the interpolation circuit produces equally sized interpolated voltage steps at an analog output.

19 Claims, 9 Drawing Sheets

5,859,606

1

INTERPOLATION CIRCUIT FOR DIGITAL-TO-ANALOG CONVERTER

BACKGROUND OF THE INVENTION

This invention relates to digital-to-analog converters, and more particularly, to improved interpolation circuits for use in digital-to-analog converters.

Commonly-assigned U.S. Pat. No. 5,396,245 shows a digital-to-analog converter that uses an interpolation circuit to provide an accurate analog output voltage in response to a digital control word. The digital-to-analog converter in the '245 patent divides the digital control word into two parts. The most significant subword controls the selection of a pair of voltages ($V_1$ and $V_2$), which bracket the desired output voltage. The least significant subword controls a bank of switches connected to an interpolation circuit that interpolates between $V_1$ and $V_2$ to generate the desired output voltage.

The interpolation circuit has a differential transconductance stage with inputs formed from composite transistors. Each composite transistor has a number of subtransistors. The switches selectively connect the gates of the subtransistors to either $V_1$ or $V_2$. The analog output voltage is increased by a given step size whenever one of the gates is switched from $V_1$ to $V_2$, where $V_2$ is larger than $V_1$. Whenever one of the gates is switched from $V_2$ to $V_1$, the output decreases by the same step size.

Although the interpolation circuit of the '245 patent is generally satisfactory, the interpolation voltage steps produced by that circuit are not always of precisely equal size, which can lead to error. The source of the variation in step size is the variation in transconductance of the subtransistors which occurs when some of the subtransistor gates are connected to $V_1$ while others are connected to $V_2$. As the subtransistor gates of some of the subtransistors are switched from $V_1$ to $V_2$, the gate-to-source voltages ($V_{GS}$) of the unswitched subtransistors increase. This causes an increase in drain current and causes the transconductances of the unswitched subtransistors to increase. As a result of the increased transconductances of the unswitched subtransistors, when the gates of the unswitched subtransistors are subsequently switched from $V_1$ to $V_2$, the interpolation voltage step size is larger than it was when previous subtransistors were switched.

It is therefore an object of the present invention to provide an improved voltage interpolation circuit for a digital-to-analog converter.

It is a further object of the present invention to provide a voltage interpolation circuit that generates voltage interpolation steps of substantially equal size.

SUMMARY OF THE INVENTION

These and other objects of the invention are accomplished in accordance with the principles of the present invention by providing a voltage interpolation circuit based on a differential transconductance stage with composite transistor inputs. The composite transistor inputs preferably have active subtransistors with corresponding voltage-controlled degeneration subtransistors. The voltage-controlled degeneration subtransistors and associated active subtransistors form functional subtransistor pairs with effective transconductances that are relatively insensitive to variations in effective gate-to-source voltage $V_{GS}'$. By maintaining the effective transconductances at a constant value, the voltage interpolation step size at the output of the interpolation circuit is held constant, thereby substantially reducing error.

2

Another aspect of the invention involves combining two parallel subtransistor legs to form a single leg with subtransistors connected in series. Replacing the two parallel legs with the series-connected leg reduces the number of components that are required and reduces the area of the interpolation circuit, while maintaining the functionality of two parallel legs.

Further features of the invention, its nature and various advantages will be more apparent from the accompanying drawings and the following detailed description of the preferred embodiments.

BRIEF DESCRIPTION OF THE DRAWINGS

FIG. 1 is similar to FIG. 5 of the '245 patent, but with new reference numerals.

DETAILED DESCRIPTION OF THE PREFERRED EMBODIMENTS

Figure 1:
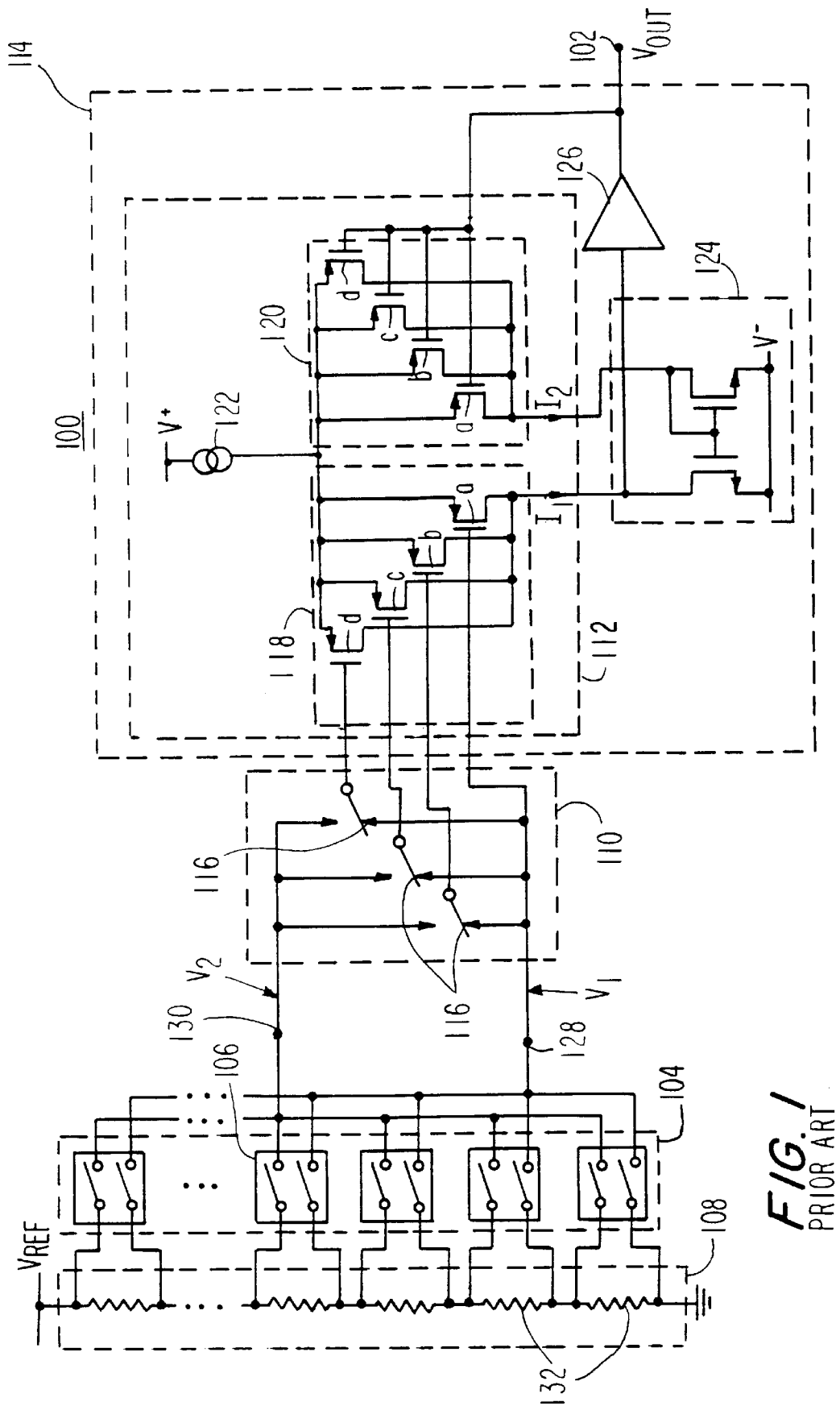
FIG. 1 is a circuit diagram of a digital-to-analog converter constructed in accordance with U.S. Pat. No. 5,396,245.

FIG. 1 shows a digital-to-analog converter of the type described in above-mentioned U.S. Pat. No. 5,396,245, which is hereby incorporated by reference herein. Digital-to-analog converter 100 produces an analog output voltage, $V_{OUT}$, at output terminal 102, based on a binary digital control word. The digital control word consists of an M-bit most significant (MS) subword and an L-bit least significant (LS) subword.

A pair of switches in switching device bank 104, such as the pair of switches in device 106, taps resistive ladder 108 at the appropriate point to select a pair of voltages ($V_1$ and $V_2$) that bracket the desired output voltage. The selection of the bracketing voltages $V_1$ and $V_2$ determines the most significant portion of the output voltage. Accordingly, the selection of $V_1$ and $V_2$ is controlled by the MS subword. Switch bank 110 and differential transconductance stage 112 of buffer 114 interpolate between the voltages $V_1$ and $V_2$ to achieve the desired output voltage using switches 116. The settings of switches 116 of switch bank 110 determine the least significant portion of the output voltage and are therefore controlled by the LS subword.

Differential transconductance stage 112 has composite transistors 118 and 120 and current source 122. The output of differential transconductance stage 112 is supplied to current mirror 124. High gain inverting amplifier 126 is used to supply the output voltage $V_{OUT}$ to terminal 102 and to provide a negative feedback to the gates of composite transistor 120.

Each switch 116 in switch bank 110 applies either $V_1$ or $V_2$ the gate of one of subtransistors 118a, 118b, 118c, or 118d of composite transistor 118. When all of switches 116 are connected to terminal 128, the voltage $V_1$ is provided to the gates of subtransistors 118a, 118b, 118c, and 118d, which causes the output voltage at terminal 102 to be $V_1$. When switches 116 are all connected to terminal 130, the voltage at output terminal 102 is close to $V_2$ (It is not exactly equal to $V_2$ because the gate of subtransistor 118a is permanently connected to terminal 128.) If some of switches 116 are connected to terminal 128 and some of switches 116 are connected to terminal 130, the resulting output voltage at terminal 102 is an interpolated value between $V_1$ and $V_2$.

Composite transistor 118 has $2^L$ subtransistors 118a–d to provide L bits of resolution. The decimal equivalent of the LS subword is $k_L$. Resistive ladder 108 has $2^M$ resistors 132 to provide M bits of resolution. The decimal equivalent of the MS subword is $k_M$.

Digital-to-analog converter 100 is highly accurate and produces analog output voltages that are a monotonic function of the digital control word made up of the MS and LS subwords. However, digital-to-analog converter 100 is not perfect. In particular, the interpolation voltage steps between $V_1$ and $V_2$ produced by composite transistor 118 are not all exactly equal in size, because the transconductances of individual subtransistors 118a–d are equal only when all of their gates are connected to the same voltage. When some of their gates are connected to $V_1$ while others are connected to $V_2$, their gate-to-source voltages are unequal, and this causes their transconductances to also be unequal. The individual gate-to-source voltages are dependent in part on the ratio of the number of subtransistor gates connected to $V_1$ to the number of subtransistor gates connected to $V_2$, so the voltage step size which results from the switching of any particular subtransistor is dependent upon the number of subtransistors already switched. Differences in the sizes of the interpolation steps can lead to inaccuracies in the output voltage $V_{OUT}$ produced in response to the digital control word.

The ideal output voltage $V_{OUT}$ is given by Equation 1.

$$V_{OUT}=V_1+k_L(V_2-V_1)/2^L \quad (1)$$

If all of the gates of subtransistors 118a–d are connected to terminal 128 by switches 116, then the drain current of each subtransistor is equal to $I_1/2^L$, where $I_1$, is the current through the left half of differential transconductance stage 112. If the gate of subtransistor 118b is subsequently connected to terminal 130, so that the gate voltage $V_{G118b}$ increases from $V_1$ to $V_2$, there is a decrease in the drain current of subtransistor 118b, as given by Equation 2.

$$I_{D118b}=I_1/2^L-\Delta I_{D118b} \quad (2)$$

The value of $\Delta I_{D118b}$ is given by Equations 3 and 4, where $g_{m118b}$ is the transconductance of subtransistor 118b.

$$\Delta I_{D118b}=g_{m118b}(V_2-V_1) \quad (3)$$

$$g_{m118b}=[2k'(W/L_G)I_1/2^L]^{1/2} \quad (4)$$

where k' is the process transconductance parameter, and the subtransistor width and length are denoted W and $L_G$ respectively. The current change $\Delta I_{D118b}$ is processed by buffer 114 and produces a corresponding increase in the voltage $V_{OUT}$ at output terminal 102.

Just after the gate of subtransistor 118b is switched from $V_1$ to $V_2$, current $I_1<I_2$. The negative feedback provided by high-gain inverting amplifier 126 and the operation of current mirror 124 respond to this inequality and cause the currents $I_1$ and $I_2$ to again equalize. Once $I_1$ is restored to its value prior to switching, the decrease $\Delta I_{D1/8b}$ in the drain current of subtransistor 118b is balanced by increases in the drain currents of the remaining subtransistors (118a, 118c, and 118d), as set forth in Equation 5.

$$I_{D118a}=I_{D118c}=I_{D118d}=I_1/2^L+\Delta I_{D118b}/(2^L-1) \quad (5)$$

The increases in the drain currents of subtransistors 118a, 118c, and 118d cause their transconductances to rise, as given by Equation 6.

$$g_{m118a,c,d}=[2k'(W/L_G)(I_1/2^L+\Delta I_{D118b}/(2^L-1))]^{1/2} \quad (6)$$

As a result, after the gate of subtransistor 118b has been connected to $V_2$, switching the gate of subtransistor 118c from $V_1$ to $V_2$ changes the drain current through subtransistor 118c by a greater amount than the drain current changed through subtransistor 118b when it was switched. The magnitude of the drain current change in subtransistor 118c when switched from $V_1$ to $V_2$ is set forth in Equation 7, where $g_{m118c}$ is given by Equation 6.

$$\Delta I_{D118c}=g_{m118c}(V_2-V_1) \quad (7)$$

The current change $\Delta I_{D118c}$ is processed by buffer 114 and produces a corresponding increase in the voltage $V_{OUT}$ at output terminal 102.

Since $g_{m118c}>g_{m118b}$, the magnitude of the interpolation voltage step produced when the gate of subtransistor 118c is switched from $V_1$ to $V_2$ is greater than the magnitude of the interpolation voltage step when the gate of subtransistor 118b was switched from $V_1$ to $V_2$. Similarly, if the gate of subtransistor 118d is switched from $V_1$ to $V_2$ after subtransistor 118c, $g_{m118d}>g_{m118c}$. The same relationship holds for each subsequently switched subtransistor. Therefore, as an increasing number of subtransistors in composite transistor 118 are switched from $V_1$ to $V_2$, the voltage steps produced at output terminal 102 increase in size. This non-uniformity in the interpolation voltage step size leads to inaccuracies in the generation of the analog output voltage.

Figure 2:
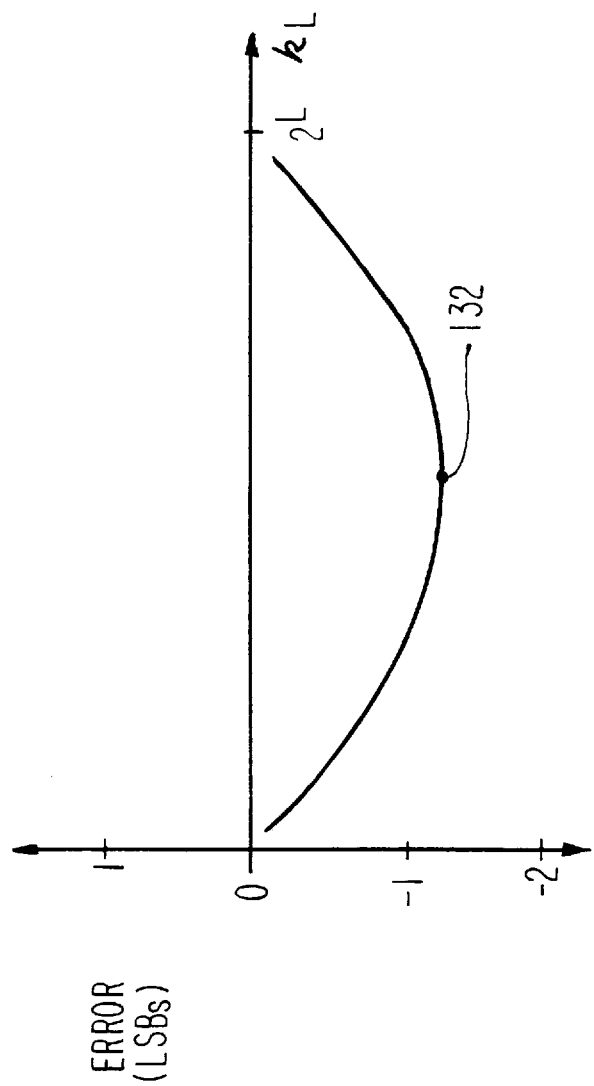
FIG. 2 is a characteristic error curve exhibited by digital-to-analog converters of the type shown in FIG. 1.

A characteristic curve of the accumulated error associated with the non-uniform interpolation voltage step size of digital-to-analog converter 100 is shown in FIG. 2 as a function of $k_L$, the decimal equivalent of the LS subword. The error $\in$ plotted in FIG. 2 is given by Equation 8.

$$\in=(v_{OUT}-[(k_L/2^L)(V_2-V_1)+V_1])/V_{LSB} \quad (8)$$

where $V_{LSB}$ is the ideal magnitude of the output voltage step for an input sequence of any two adjacent codes, and $\in$ is the output voltage error normalized to $V_{LSB}$.

At low values of $k_L$, the interpolation voltage step size is effectively too small, so the analog output voltage $V_{OUT}$ at terminal 102 lags the ideal output voltage value. Accordingly, for small values of $k_L$, the error given by Equation 8 is negative. When $k_L$ is approximately $2^L/2$, the accumulated error at output terminal 102 reaches its peak magnitude (point 132). Typically, the peak accumulated error ranges from 0.5 to 4 least significant bits (LSBs), depending on the electrical characteristics and component values of digital-to-analog converter 100. For large values of $k_L$, the interpolation voltage step size is effectively too large. As a result, the accumulated error at output 102 is reduced in magnitude as $k_L$ increases past $2^L/2$.

Figure 3:
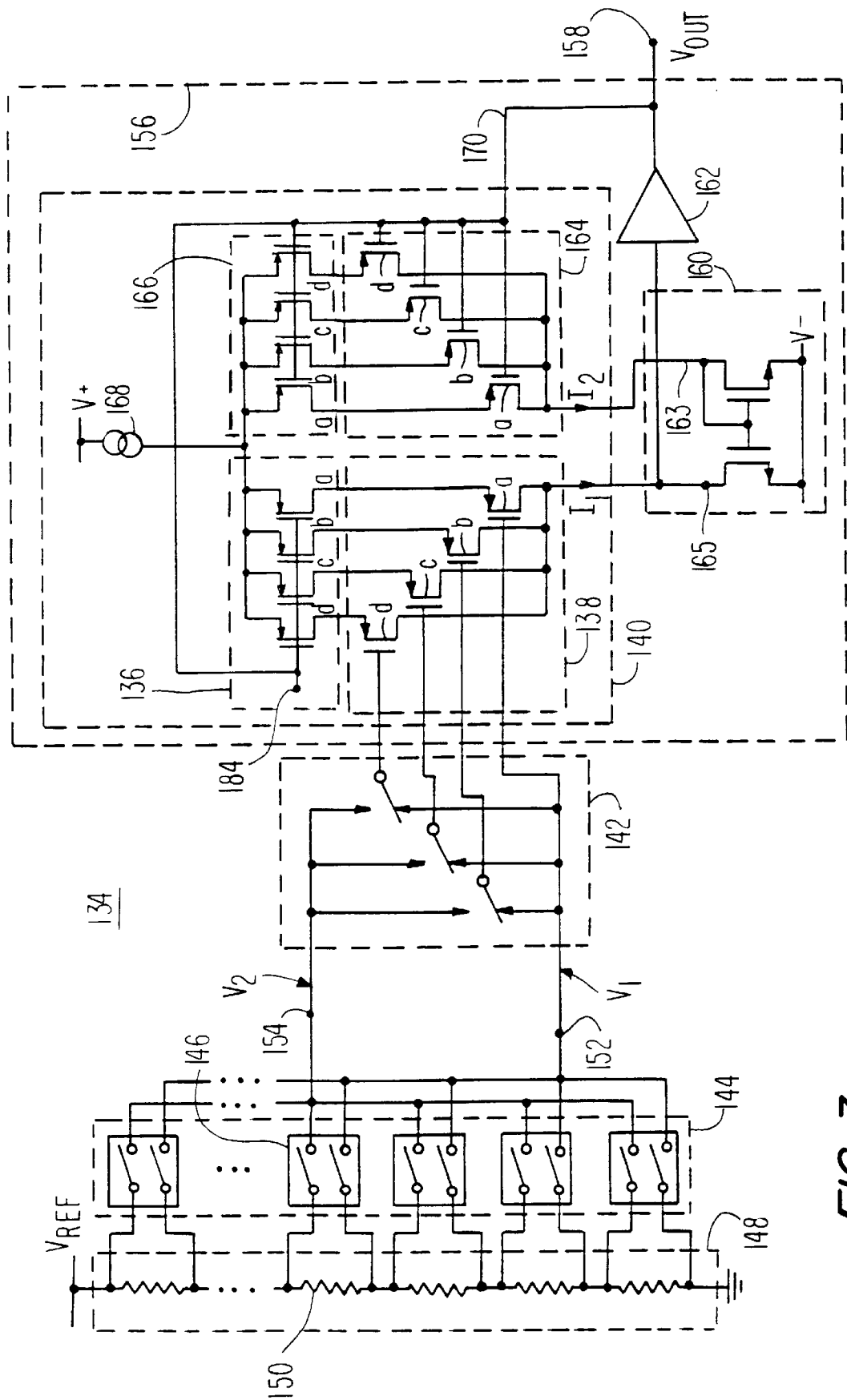
FIG. 3 is a circuit diagram of an illustrative digital-to-analog converter constructed in accordance with the principles of the present invention.

As shown in FIG. 3, digital-to-analog converter 134 of the present invention uses voltage-controlled degeneration subtransistors 136a–d to correct for the characteristic error curve of FIG. 2. Composite active transistors 138 and 164 and composite degeneration transistors 136 and 166 form the inputs of differential transconductance stage 140. The gates of subtransistors 138a–d are connected to switch bank 142, which is controlled by the LS subword.

The MS subword controls switching device bank 144. For example, device 146 of switching device bank 144 can connect to resistive ladder 148 at the ends of resistor 150 in accordance with the MS subword to provide voltages $V_1$ and $V_2$ at terminals 152 and 154, respectively.

Switch bank 142 and output buffer 156 interpolate between the voltages $V_1$ and $V_2$ to produce the desired voltage output $V_{OUT}$ at output terminal 158. Output buffer 156 uses differential transconductance stage 140, current mirror 160, biasing current source 168, and high-gain inverting amplifier 162 to maintain the current $I_1$ through the left half of differential transconductance stage 140 equal to the current $I_2$ through the right half of differential transconductance stage 140. Path 170 provides negative feedback from amplifier 162 to differential transconductance stage 140. In one suitable configuration for digital-to-analog converter 134, current $I_1=I_2=2.5$ $\mu A$; the voltage drop over each resistor is $V_2-V_1=78.125$ mV; $V^-=0$ V; $V^+=5$ V; and $V_{REF}=2.5$ V. If desired, the polarities of current mirror 160 and amplifier 162 can be reversed. In this case, the current mirror is connected such that its input is taken from node 165. The amplifier is then non-inverting, and its input is taken from node 163.

Voltage-controlled degeneration subtransistors 166a–d and composite active transistor 164 in the right half of differential transconductance stage 140 balance voltage-controlled degeneration subtransistors 136a–d and composite active transistor 138 in the left half of differential transconductance stage 140. If desired, composite active transistor 164 and voltage-controlled degeneration subtransistors 166a–d can be fabricated as a single-element transistor structure. However, to precisely match the characteristics of composite active transistor 138 and degeneration subtransistors 136a–d, composite active transistor 164 is preferably formed from individual subtransistors 164a–d, and voltage-controlled degeneration subtransistors 166a–d are preferably individual structures matched to voltage-controlled degeneration subtransistors 136a–d. Voltage-controlled degeneration subtransistors 136a–d and 166a–d and active subtransistors 138a–d and 164a–d form a plurality of functional subtransistor pairs, which are preferably formed as integrated metal-oxidesemiconductor (MOS) structures.

We now define the effective gate-to-source voltage $V_{GS}'$ of a functional subtransistor pair to be the voltage difference between the gate of an active subtransistor and the source of its associated degeneration subtransistor. We further define the effective transconductance $g_m'$ of a functional subtransistor pair to be the ratio of the incremental change in drain current $I_D$ of the pair to the incremental change in effective gate-to-source voltage $V_{GS}'$ of the pair, that is, $g_m' \equiv dI_D/dV_{GS}'$.

Consider, in digital-to-analog converter 134, a generalized functional subtransistor pair made up of one constituent active subtransistor 138x of composite active transistor 138 and one constituent degeneration subtransistor 136x of composite degeneration transistor 136. Let the subtransistor pair operate at drain current $I_{D138x}$ and effective gate-to-source voltage $V_{GS1}'$. If we let $|V_{GS1}'|$ increase by some voltage increment $|\Delta V_{GS1}'|$, we find that $|V_{GS138x}|$ and $|V_{DS136x}|$ become larger by increments $|\Delta V_{GS138x}|$ and $|\Delta V_{DS136x}|$ respectively, distributing the total increase $|\Delta V_{GS1}'|$ between them according to their W and $L_G$ values (note that $|\Delta V_{GS138x}|+|\Delta V_{DS136x}|=|\Delta V_{GS1}'|$). As $|V_{GS138x}|$ rises, its transconductance $g_{m138x}$ becomes larger, and this tends to increase the effective transconductance $g_m'$ of the functional subtransistor pair. Conversely, as $|V_{DS136}|$ rises, its drain-to-source resistance $r_{DS}$ becomes larger. It therefore provides more degeneration (local negative feedback) to active subtransistor 138x, and this tends to decrease the effective transconductance $g_m'$ of the functional subtransistor pair. There exists at least one combination of W and $L_G$ values which, when applied to functional subtransistor pair (138x, 136x) causes these two effects to cancel. That is, the increase in effective transconductance $g_m'$ caused by $|\Delta V_{GS138x}|$ is just equal and opposite to the decrease in effective transconductance $g_m'$ caused by $|\Delta V_{DS1136x}|$. Therefore, effective transconductance $g_m'$, is a substantially constant function of effective gate-to-source voltage $V_{GS}'$ for generalized subtransistor pair (138x, 136x) over an appropriately chosen interval of $V_{GS}'$.

Now consider in digital-to-analog converter 134 a particular functional subtransistor pair made up of active subtransistor 138b and degeneration subtransistor 136b.

Initially, if active subtransistors 138a–d are connected to terminal 152 by switch bank 142, so that the gates of active subtransistors 138a–d are at $V_1$, then the output voltage at output terminal 158 is $V_{OUT}=V_1$. If switch bank 142 subsequently connects the gate of active subtransistor 138b to terminal 154 at voltage $V_2$, then the effective gate-to-source voltage magnitude $|V_{GS}'|$ of functional pair (138b, 136b) is made to decrease by an amount $V_2-V_1$; the drain current $I_{D138b}$ 10 of the pair falls accordingly, causing a drop in output current $I_1$ of differential transconductance stage 140. Inverting amplifier 162 responds to the resultant inequality $I_1<I_2$ by increasing $V_{OUT}$ until equality is reestablished by negative feedback. When a new equilibrium point has been reached where $I_1=I_2$, the step increase in output voltage $\Delta V_{OUT1}$ at terminal 158 is given by the expression $\Delta V_{OUT1} \cong (V_2-V_1)/2^L$, where L=2 for digital-to-analog converter 134.

The decrease in $|V_{GS}'|$ of the switched pair (138b, 136b) is the difference between the change $(V_2-V_1)$ in 138b gate voltage and the resultant step increase $\Delta V_{OUT}$ in output voltage, and is given by Equation 9.

$$|\Delta V_{GS}'|=(V_2-V_1)-(V_2-V_1)/2^L=(2^L-1)(V_2-V_1)/2^L \quad (9)$$

This decrease is distributed between incremental decreases in $|V_{GS138b}|$ and $|V_{DS136b}|$ according to the W and $L_G$ values of 138b and 136b. Similarly, the increase in $|V_{GS}'|$ of the unswitched pairs (138a, 136a), (138c, 136c), and (138d, 136d) caused by the step increase in $V_{OUT}$ is distributed between positive increments in $|V_{GS}|$ of each unswitched active subtransistor and in $|V_{DS}|$ of each associated degeneration subtransistor according to their W and $L_G$ values. As in the general case, if appropriate W and $L_G$ values have been chosen, then the effective transconductances of switched and unswitched functional subtransistor pairs are substantially equal before and after switching.

If switch bank 142 now connects the gate of active subtransistor 138c to terminal 154 at voltage $V_2$ (so that the gates of active subtransistors 138b and 138c are both at $V_2$), then each functional subtransistor pair on the left side of differential transconductance stage 140 settles to a new value of $|V_{GS}'|$. But because the functional subtransistor pairs formed by active subtransistors 138a–d and voltage-controlled degeneration subtransistors 136a–d have essentially constant effective transconductances over the chosen interval, the present output voltage change $\Delta V_{OUT2}$ is substantially equal to the previous output voltage change $\Delta V_{OUT}$; that is, $\Delta V_{OUT2} = \Delta V_{OUT1}$.

If we extend the results of this example to a voltage interpolation circuit of resolution L bits, where L is some arbitrary positive integer, we can say that if the gates of the $2^L$ constituent subtransistors of composite active transistor 138 are individually switched in cumulative progression from $V_1$ to $V_2$, then the $2^L-1$ interpolated voltage steps produced at output terminal 158 are of substantially equal size. The interpolation voltage step sizes of digital-to-analog converter 134 are therefore not subject to the errors inherent when using the interpolation scheme of digital-to-analog converter 100 (FIG. 1).

To ensure that the effective transconductances of the subtransistor pairs are constant during interpolation, the device geometries of degeneration subtransistors 136a–d and 166a–d and active subtransistors 138a–d and 164a–d must be chosen properly. The total gate length for each subtransistor pair (e.g., the gate length of one of voltage-controlled degeneration subtransistor 136a–d plus the gate length of its associated active subtransistor 138a–d) need not be greater than the gate length for subtransistors 118a–d in digital-to-analog converter 100 (FIG. 1).

Figure 4:
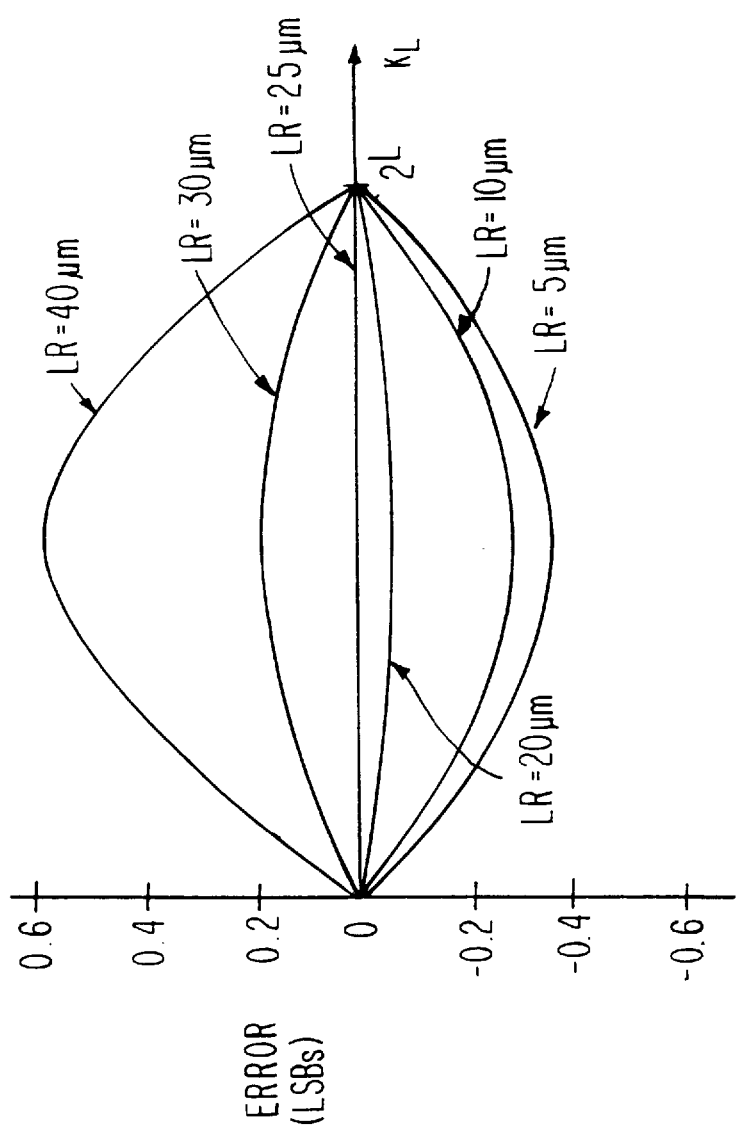
FIG. 4 is a graph of the calculated error of an interpolation circuit having voltage-controlled degeneration subtransistors of various lengths.

The appropriate ratio of the gate lengths of degeneration subtransistors 136a–d and 166a–d to the gate lengths of active subtransistors 138a–d and 164a–d may be determined by evaluating the error that results for various gate length combinations. FIG. 4 shows a series of error curves similar to the characteristic error curve of FIG. 2. The error curves of FIG. 4 show the calculated error using voltage-controlled degeneration subtransistors with different gate lengths, LR. The conditions used for calculation of the curves shown in FIG. 4 are as follows: the total gate length for each functional subtransistor pair is held constant at $L_T = 50$ μm; the gate width for all subtransistors is W=7 μm; current $I_1=I_2=$ 2.5 μA; the voltage drop over each resistor is $V_2-V_1=78.125$ mV; $V^-=0$ V; $V^+=5$ V; and $V_{REF}=2.5$ V. The resolution of the LS subword is L=5 bits, so that $2^L=32$. The granularity of the error curves is smoothed for illustrative purposes.

As shown in FIG. 4, the characteristic error curve was minimized when LR=25 μm (half of the total gate length). Accordingly, one suitable arrangement for digital-to-analog converter 134 is for voltage-controlled degeneration subtransistors 136a–d and 166a–d and active subtransistors 138a–d and 164a–d to have gate lengths of 25 μm and gate widths of 7 μm.

Figure 5:
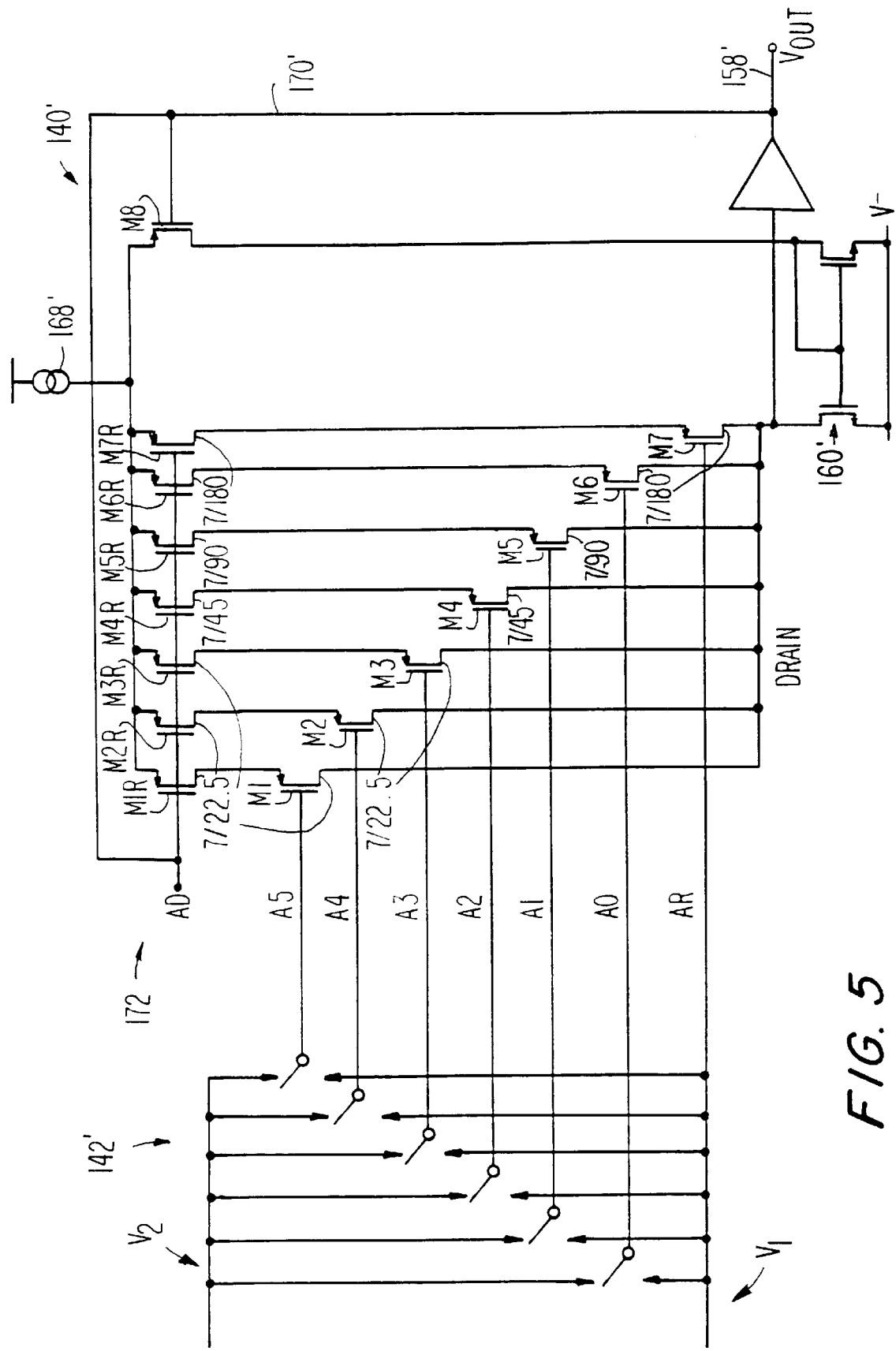
FIG. 5 shows an interpolation circuit having voltage-controlled degeneration subtransistors and a binary weighing scheme.

Another aspect of the present invention involves reducing the number of transistors and the amount of silicon die area occupied by the digital-to-analog converter 134. One approach for reducing transistor count and decreasing die area is shown in FIG. 5. Composite input circuit 172 is suitable for use in a digital-to-analog converter such as digital-to-analog converter 134 (FIG. 3). In digital-to-analog converter 134, composite input circuit 172 takes the place of composite active transistor 138 and composite degeneration transistor 136 in the left half of differential transconductance stage 140. To balance both sides of differential transconductance stage 140' of FIG. 5, transistor M8 or circuitry identical to composite input circuit 172 is provided on the right side of differential transconductance stage 140' and is connected to feedback path 170', current source 168', and current mirror 160' in place of composite active transistor 164 (FIG. 3) and composite degeneration transistor 166 (FIG. 3).

Composite input circuit 172 contains voltage-controlled degeneration subtransistors M1R, M2R, M3R, M4R, M5R, M6R, and M7R and active subtransistors M1, M2, M3, M4, M5, M6, and M7. The gate widths and lengths of each component are shown adjacent to the component. For example, voltage-controlled degeneration subtransistor M4R has a gate width of 7 μm and a gate length of 45 μm. Subtransistor M4 has a gate width of 7 μm and a gate length of 45 μm. The gate lengths of voltage-controlled degeneration resistors M1R–M7R are selected to correct for the characteristic error curve of FIG. 2 and thereby provide accurate voltage interpolation steps at output terminal 158'.

Binary weighting allows composite input circuit 172 to interpolate over the voltage range $V_1$ to $V_2$ with the same resolution as interpolation circuits with some 32 evenly weighted subtransistor pairs. As shown in FIG. 5, M1, M2, and M3 have gate lengths of 22.5 μm, which is half of the gate length of M4. Accordingly, when any one of gate control lines A5, A4, or A3 is switched from $V_1$ to $V_2$, the resulting interpolation voltage step has twice the magnitude of the interpolation voltage step generated when control line A2 is switched from $V_1$ to $V_2$. M5, M6, and M7 also have various different gate lengths. With the gate lengths shown in FIG. 5, M1, M2, and M3 each provide 8 LSBs of interpolation. M4 provides 4 LSBs of interpolation and M5 provides 2 LSBs of interpolation. M6 and M7 each provide 1-LSB of interpolation. Control line AR is preferably directly connected to $V_1$, so that M7 provides a "remainder bit" of voltage offset. Control lines A0–A5 are connected to either $V_1$ or $V_2$ with the switches in switch bank 142'. Providing subtransistors M1–M7 with different weights makes it possible to interpolate over a greater dynamic range than possible when all subtransistors have the same weight. Because subtransistors M6 and M7 are capable of providing voltage steps of 1-LSB, the resolution of composite input circuit 172 is essentially the same as a circuit having only 1-LSB subtransistors.

Figure 6:
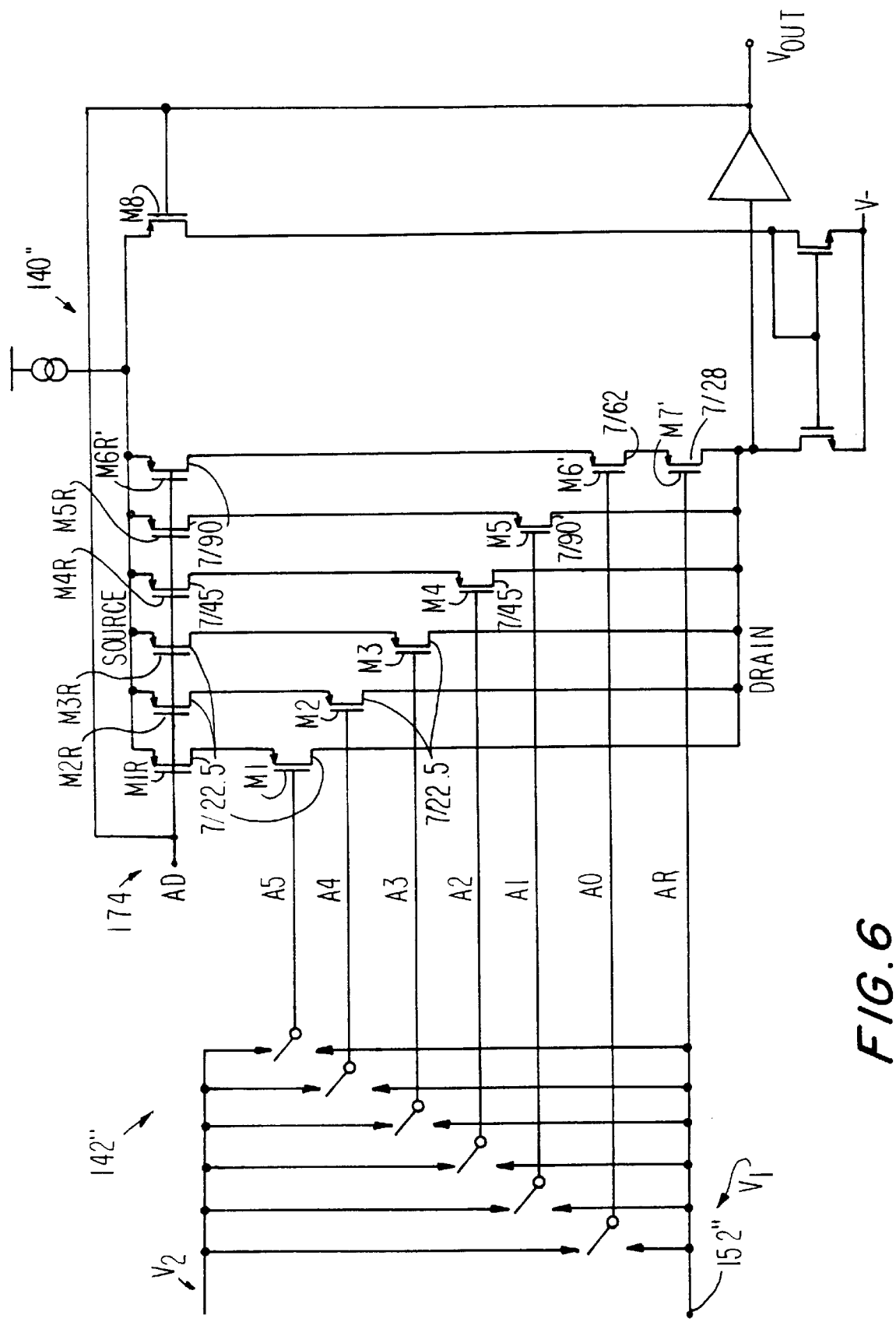
FIG. 6 shows an interpolation circuit similar to that of FIG. 5 in which two parallel subtransistors have been replaced with a series-connected pair of subtransistors.

FIG. 6 shows an alternative to the composite input circuit arrangement of FIG. 5. Composite input circuit 174 is used in digital-to-analog converter 134 (FIG. 3) in the same way as composite input circuit 172 (FIG. 5). Composite input circuit 174 forms the left half of differential transconductance stage 140". Control lines A0–A5 are connected to switches in switch bank 142". Control line AR is directly connected to terminal 152". Transistor M8 or a circuit identical to composite input circuit 174 is provided for the right half of differential transconductance stage 140" to balance stage 140".

Voltage-controlled degeneration subtransistors M1R–M5R of composite input circuit 174 operate in the same way as degeneration subtransistors M1R–M5R in composite input circuit 172. Subtransistors M1–M5 are also the same in composite input circuit 174 as they are in composite input circuit 172. Binary weighting is used to reduce the component count. However, in composite input circuit 174, the last two parallel legs of composite input circuit 172 are combined to form a single leg with subtransistors M6' and M7' connected in series. The leg made up of subtransistors M6' and M7' and voltage-controlled degeneration subtransistor M6R' provides both a 1-LSB remainder function controlled by control line AR (as was performed by M7R and M7 in composite input circuit 172) and a 1-LSB interpolation voltage step controlled by control line A0 (as was performed by M6R and M6 in composite input circuit 172). The advantage of the configuration of composite input circuit 174 is that it requires less area than the configuration of composite input circuit 172 and uses fewer components.

The reduction in area achieved by the configuration of composite input circuit 174 is due to the reduced component count and the reduced gate length of the components that are used. The two degeneration subtransistors M6R and M7R and two active subtransistors M6 and M7 of composite input circuit 172, each of which has a gate length of 180 $\mu$m, are replaced by a single voltage-controlled degeneration subtransistor M6R' and two active subtransistors M6' and M7' with respective gate lengths of 90 $\mu$m, 62 $\mu$m, and 28 $\mu$m. The gate lengths of voltage-controlled degeneration subtransistors M1R–M5R and M6R' are chosen to eliminate the characteristic error curve of FIG. 2. Preferably, the gate length of voltage-controlled degeneration resistor M6R' (90 $\mu$m) is equal to the sum of the gate lengths of subtransistors M6' (62 $\mu$m) and M7' (28 $\mu$m)

Although series-connected subtransistors M6' and M7' are shown in FIG. 6 in conjunction with a binary weighting scheme, parallel subtransistor legs can be combined into a single series-connected leg regardless of the specific weighting scheme used for the remainder of the subtransistors in the composite input circuit. In addition, it is not necessary for the series-connected subtransistors to be combined with a voltage-controlled degeneration subtransistor. For example, in applications where the interpolation circuits of the above-mentioned '245 patent are satisfactory, it is possible to reduce the interpolation circuit component count and circuit area by replacing two or more parallel legs with one or more series-connected subtransistors, regardless of whether voltage-controlled degeneration subtransistors are used in the circuit.

Figure 7:
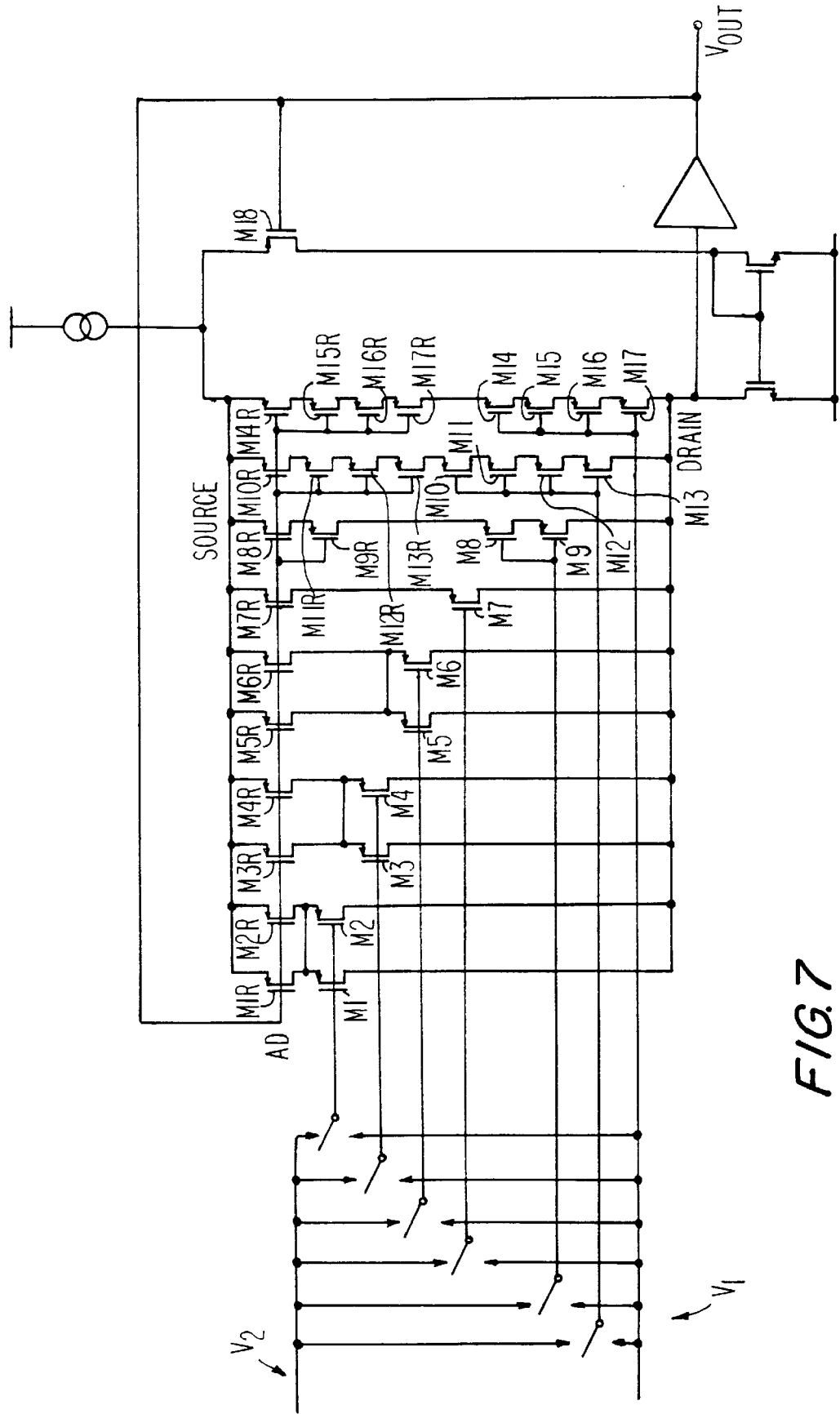
FIG. 7 shows an interpolation circuit similar to that of FIG. 5. This circuit uses a multiplicity of identical p-type metal-oxide-semiconductor (PMOS) devices which function both as active subtransistors and as voltage-controlled degeneration subtransistors, to achieve binary weighting with optimal matching precision.

FIG. 7 shows an embodiment of the composite input circuit which uses a multiplicity of identical PMOS subtransistors to achieve binary weighting with optimal matching precision. The FIG. 7 arrangement uses the same weighting scheme shown in FIG. 5, but uses individual identical subtransistors, rather than subtransistors with different gate lengths. For each subtransistor in FIG. 7, W=7 $\mu$m and $L_G$=12 $\mu$m. By connecting transistors such as M14, M15, M16, and M17 in series and connecting their gates in parallel, the arrangement of FIG. 7 creates combined transistors with effective gate lengths that are equal to the sum of the gate lengths of their individual transistors.

Transistors such as M1 and M2 are connected in parallel and their gates are also connected in parallel. Such an arrangement creates combined transistors with effective gate widths that are twice as large as each individual transistor. Transistors such as M1 and M2 are driven in parallel. If desired, optional conductors such as conductor 176 may be provided to increase layout efficiency.

Figure 8:
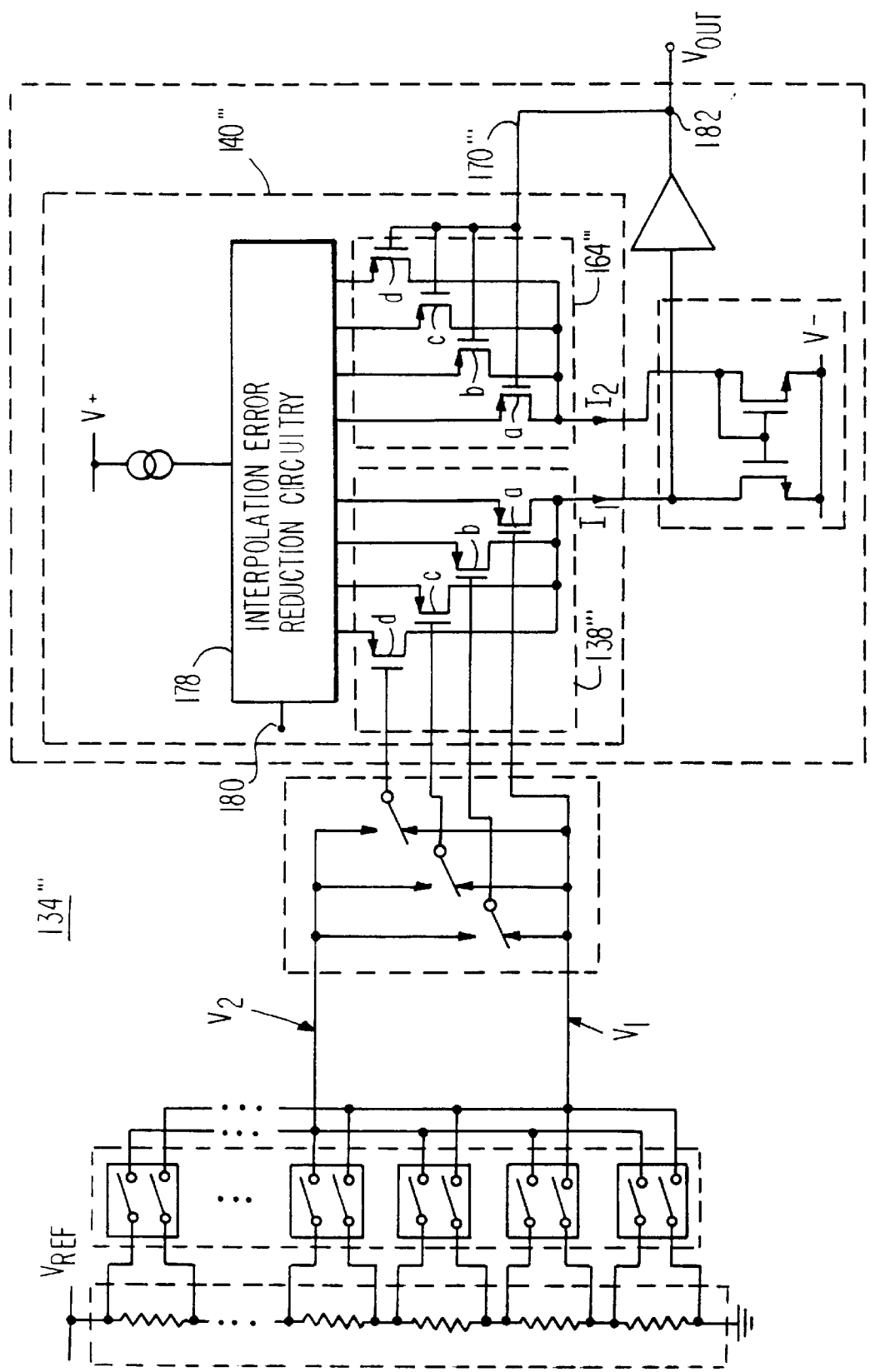
FIG. 8 is a circuit diagram similar to that of FIG. 3, showing how interpolation error reduction circuitry can be used to linearize the transfer function of a digital-to-analog converter.

FIG. 8 shows a digital-to-analog converter 134''' that uses generalized interpolation error reduction circuitry 178 to linearize the digital-to-analog transfer function of digital-to-analog converter 134'''. The left side of differential transconductance stage 140''' has composite active transistor 138''' and the right side of differential transconductance stage 140''' has a single balancing transistor or composite active transistor 164'''. Interpolation error reduction circuitry 178 may contain any suitable circuitry for linearizing the transfer function of digital-to-analog converter 134'''. (For example, interpolation error reduction circuitry 178 may contain degeneration subtransistors, as shown in the arrangement of FIG. 3.) Typically, interpolation error reduction circuitry 178 contains voltage-controlled resistance elements and receives a control voltage at control node 180 that is used to control the resistance of these elements. The control voltage applied to control node 180 is a function of the output voltage signal at node 182, and is chosen to linearize the transfer function of digital-to-analog converter 134'''. In the illustrative arrangement of FIG. 3, the voltage $V_{OUT}$ from output node 158 is applied directly to control node 184 via feedback path 170.

Figure 9:
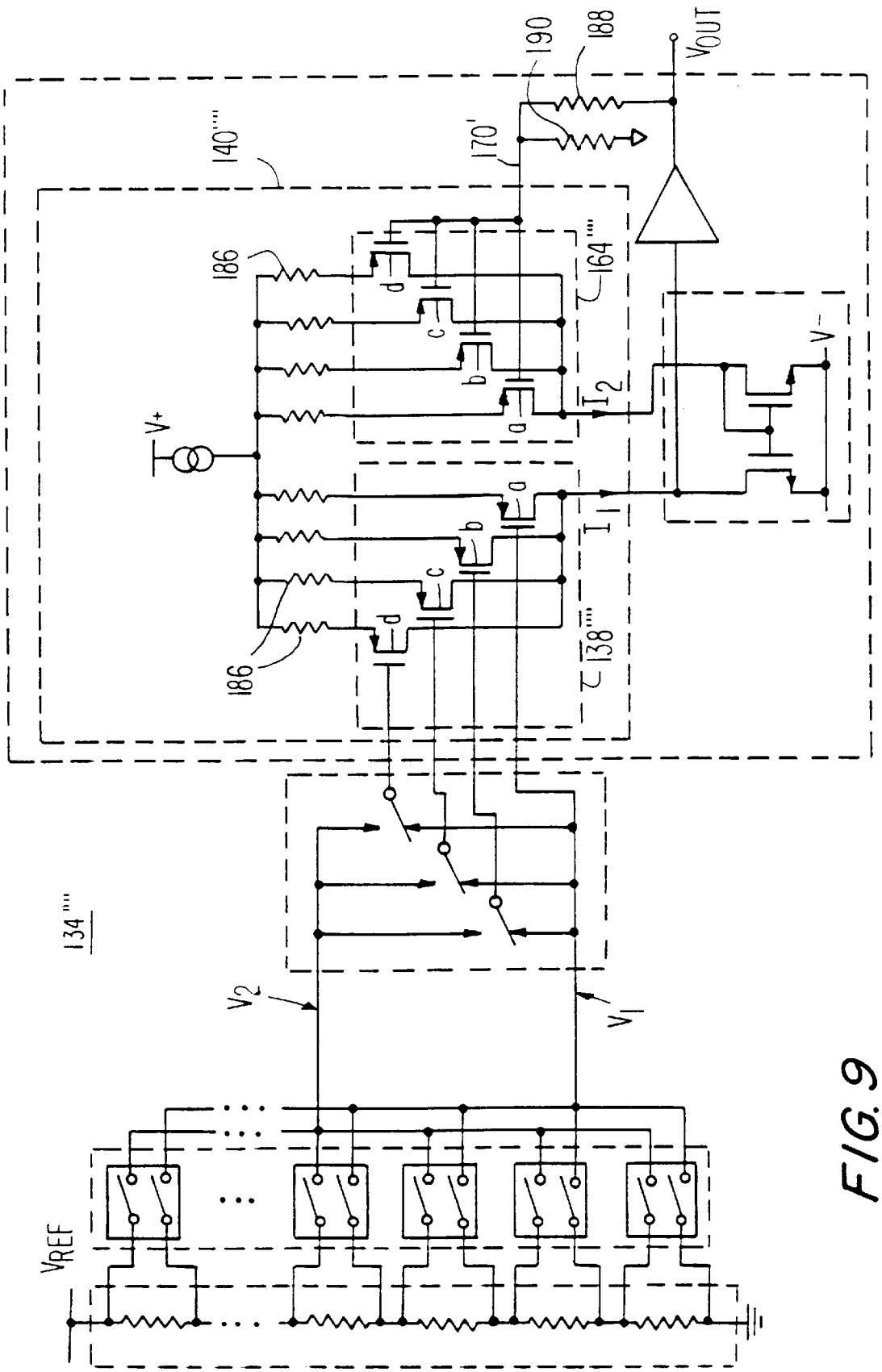
FIG. 9 is a circuit diagram similar to that of FIG. 3, showing how resistors can be used to linearize the transfer function of a digital-to-analog converter.

FIG. 9 shows an arrangement in which no control voltage is required for the interpolation error reduction circuitry. The error reduction circuitry in FIG. 9 is made up of resistors 186 that linearize the transfer function of digital-to-analog converter 134''''. In digital-to-analog converter 134'''', each resistor 186 is paired with an associated active subtransistor in composite transistor 138'''' (and composite transistor 164'''', if the balancing circuitry in the right half of differential transconductance stage 140'''' is provided by a composite transistor). Adding resistors 186 in series with the subtransistors in composite transistor 138'''' and composite transistor 164'''' makes the effective transconductance of each resistor-subtransistor pair less sensitive to changes in its effective gate-to-source voltage $V_{GS}'$. Resistors 186 therefore tend to linearize the digital-to-analog transfer function of digital-to-analog converter 134'''' in a relatively simple and cost-effective manner.

If desired, any of the foregoing digital-to-analog circuit arrangements may use resistors such as resistors 188 and 190 of FIG. 9 to provide a closed-loop gain other than unity.

The foregoing is merely illustrative of the principles of this invention and various modifications can be made by those skilled in the art without departing from the scope and spirit of the invention.

For example, buffer 156 could be configured with feedback to have a gain other than unity; the circuit could be modified to have any number of LS or MS bits; the switches in switch bank 142 could be switched one at a time (thermometer code) or in binary combinations; the circuit could be used in analog-to-digital converters; attenuation could be added to reference voltage $V_{REF}$; a resistor could be substituted for current source 168; current mirror 160 and amplifier 162, which together form a differential-current-to-single-ended-voltage-output conversion stage, could be replaced by substantially any other type of differential-current-to-voltage converter used in conventional operational amplifier design; transistor and/or current polarity could be reversed; bipolar transistors, or some other technology, could be used for any or all of the circuit; any controlled-impedance device could be used in place of composite voltage-controlled degeneration transistors 136 and 166; the invention could be used to create, rather than to correct, a bow or other nonlinearity in an interpolator digital-to-analog transfer curve; the invention could be used to develop precisely controlled but non-uniform step sizes; currents $I_1$ and $I_2$ could be scaled relative to each other; or the gates of composite degeneration subtransistors 136 and/or 166 could be connected to some other terminal for purposes of controlling the transconductances of the functional subtransistor pairs. The described embodiments are presented for purposes of illustration and not limitation, and the present invention is limited only by the claims which follow.

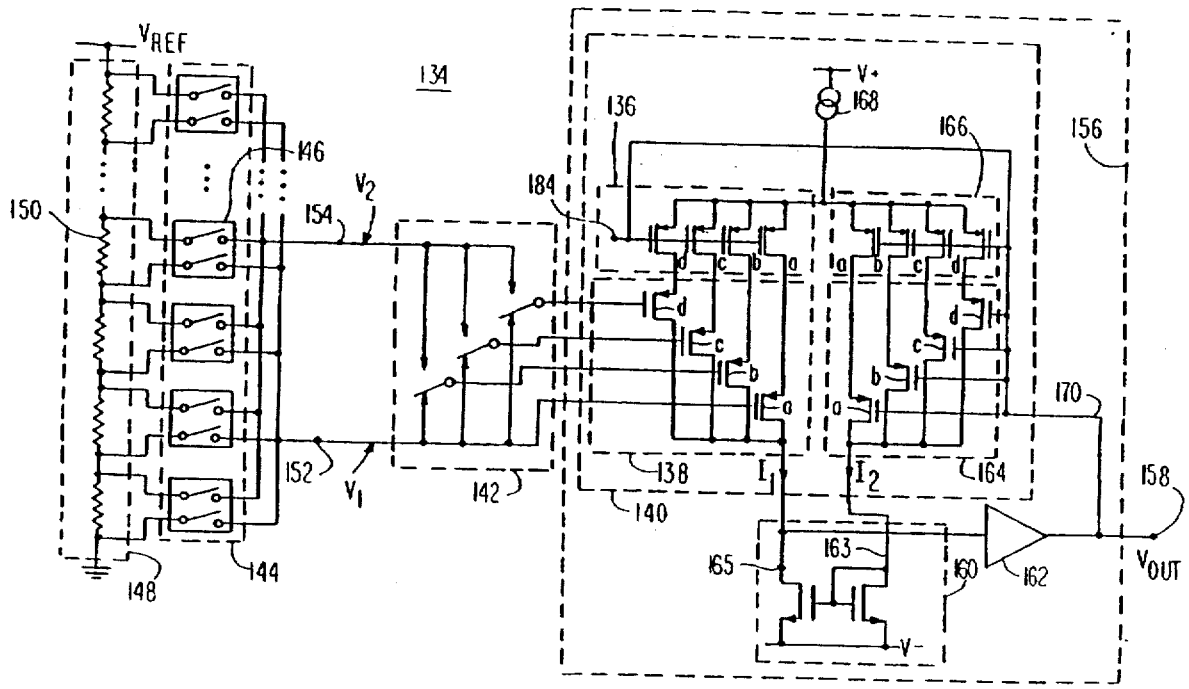

What is claimed is:

1. A composite input circuit for use in an interpolation circuit that interpolates between a first voltage and a second voltage in response to a digital control word to produce an analog output voltage, the interpolation circuit having a first terminal for supplying the first voltage, a second terminal for supplying the second voltage, a differential transconductance stage having a first half and having a second half formed of at least one transistor having a control gate, a source, and a drain, a current source having an output to which the source of the at least one transistor in the second half of the differential transconductance stage is coupled, an output terminal for supplying the analog output voltage, and a feedback path for coupling the output terminal to the control gate of the at least one transistor in the second half of the differential transconductance stage, the composite input circuit comprising:

a plurality of active subtransistors in the first half of the differential transconductance stage each of which has a gate selectively connected to either the first terminal or the second terminal, a source, and a drain connected to a first half common drain node; and interpolation error reduction circuitry connected between the current source output and the sources of the active subtransistors in the first half of the differential transconductance stage.

2. The circuit defined in claim 1 wherein the interpolation error reduction circuitry comprises a plurality of degeneration subtransistors each having a source connected to the output of the current source, a drain connected to a respective one of the sources of the plurality of active subtransistors, and a control gate connected to a control node.

3. The circuit defined in claim 2 wherein the at least one transistor in the second half is coupled to the output of the current source by at least one degeneration transistor with a drain connected to the source of the at least one transistor, a source connected to the output of the current source, and a control gate connected to the control node.

4. The circuit defined in claim 2 wherein the control node is connected to the feedback path.

5. The circuit defined in claim 2, wherein the plurality of degeneration subtransistors and the plurality of active subtransistors form the first half of the differential transconductance stage for providing a first current, the second half of the differential transconductance stage being identical to the first half except that the control gates of the active subtransistors are connected to the feedback path and the drains of the active subtransistors are connected to a second half common drain node, the second half providing a second current.

6. The circuit defined in claim 5 further comprising a current mirror, one half of the current mirror receiving the first current via the first half common drain node and the other half of the current mirror receiving the second current via the second half common drain node.

7. The circuit defined in claim 6 further comprising an amplifier connected between the first half common drain node and the output terminal.

8. The circuit defined in claim 6 further comprising an amplifier connected between the second half common drain node and the output terminal.

9. The circuit defined in claim 2 wherein the interpolation error reduction circuitry comprises a plurality of resistors each connected between the output of the current source and a respective one of the sources of the plurality of active subtransistors.

10. The circuit defined in claim 2 wherein the degeneration subtransistors and the active subtransistors form respective subtransistor pairs that have effective transconductances that are substantially constant as the active subtransistor gates are switched from the first voltage to the second voltage, so that substantially equal-sized interpolation steps are provided at the output terminal.

11. The circuit defined in claim 2 wherein at least one of the degeneration subtransistors and two of the active subtransistors are connected in series between the current source output terminal and the first half common drain terminal.

12. The circuit defined in claim 1 wherein at least some of the active subtransistors are binary weighted.

13. The circuit defined in claim 12 wherein at least some of the binary weighted active subtransistors are combined transistors formed from multiple identical active subtransistors.

14. The circuit defined in claim 13 wherein at least one of the combined transistors is formed from series-connected identical active subtransistors.

15. The circuit defined in claim 13 wherein at least one of the combined transistors is formed from parallel-connected identical active subtransistors.

16. The circuit defined in claim 1 wherein at least some of the active subtransistors are non-binary weighted.

17. The circuit defined in claim 1, wherein the digital control word is a least significant digital control word, the circuit further comprising:

a resistive ladder for supplying the first and second voltages; and a switching device bank responsive to a most significant digital control word for selecting the first and second voltages from the resistive ladder and providing the first and second voltages to the first and second terminals.

18. A composite input circuit for use in an interpolation circuit that interpolates between a first voltage and a second voltage in response to a digital control word to produce an analog output voltage, the interpolation circuit having a first terminal for supplying the first voltage, a second terminal for supplying the second voltage, a differential transconductance stage having a first half and having a second half formed of at least one transistor having a control gate, a source, and a drain, a current source having an output to which the source of the at least one transistor in the second half of the differential transconductance stage is coupled, an output terminal for supplying the analog output voltage, and a feedback path for coupling the output terminal to the control gate of the at least one transistor in the second half of the differential transconductance stage, the composite input circuit comprising:

a first active subtransistor in the first half of the differential transconductance stage having a gate selectively connected to either the first terminal or the second terminal, a first active subtransistor source coupled to the output of the current source, and a first active subtransistor drain; and a second active subtransistor in the first half of the differential transconductance stage having a gate selectively connected to either the first terminal or the second terminal, a second active subtransistor source connected to the first active subtransistor drain such that the first and second active subtransistors are series-connected, and a second active subtransistor drain connected to a common drain node.

19. The circuit defined in claim 18 further comprising:

a control node; and a degeneration subtransistor having a control gate connected to the control node, a source, and a drain, wherein the first active subtransistor is coupled to the output of the current source by connecting the source of the degeneration subtransistor to the output of the current source and by connecting the drain of the degeneration subtransistor to the source of the first active subtransistor.

* * * * *

UNITED STATES PATENT AND TRADEMARK OFFICE
CERTIFICATE OF CORRECTION

PATENT NO. : 5,859,606
DATED : January 12, 1999
INVENTOR(S) : Victor P. Schrader et al.

It is certified that error appears in the above-indentified patent and that said Letters Patent is hereby corrected as shown below:

The title page, showing the illustrative figure, should be deleted, and substitute therefor the attached title page.

Column 4, lines 59, change "$\epsilon$" to -- $\varepsilon$ --.
Column 4, lines 60, change "$\epsilon$" to -- $\varepsilon$ --.
Column 4, lines 62, change "$\epsilon$" to -- $\varepsilon$ --.
Column 6, line 24, change "$\Delta V_{DS1136x}$" to -- $\Delta V_{DS136x}$ --.
Column 7, line 10, change "$\Delta V_{OUT}$" to -- $\Delta V_{OUT1}$ --.

Signed and Sealed this

Thirtieth Day of November, 1999

Attest:

Q. TODD DICKINSON

Attesting Officer

Acting Commissioner of Patents and Trademarks

United States Patent [19]

Schrader et al.

[11] Patent Number: 5,859,606
[45] Date of Patent: Jan. 12, 1999

[54] INTERPOLATION CIRCUIT FOR DIGITAL-TO-ANALOG CONVERTER

[75] Inventors: Victor Paul Schrader, Oakland; James Lee Brubaker, Santa Cruz, both of Calif.

[73] Assignee: Linear Technology Corporation, Milpitas, Calif.

[21] Appl. No.: 910,482

[22] Filed: Jul. 25, 1997

[51] Int. Cl.[6] .................................................. H03M 1/66
[52] U.S. Cl. ....................................... 341/144; 341/150
[58] Field of Search ..................................... 341/144, 141, 341/143, 159, 172, 150

[56] References Cited

U.S. PATENT DOCUMENTS

| | | | |
|---|---|---|---|
| 5,235,334 | 8/1993 | Manvar et al. | 341/143 |
| 5,313,205 | 5/1994 | Wilson | 341/144 |
| 5,396,245 | 3/1995 | Rempfer | 341/145 |

*Primary Examiner*—Brian Young
*Attorney, Agent, or Firm*—Fish & Neave; G. Victor Treyz

[57] ABSTRACT

A voltage interpolation circuit for a digital-to-analog converter comprises a differential amplifier with composite input devices, each of which is composed of multiple active subtransistors. Interpolation is effected between a first voltage and a second voltage by selectively connecting the gates of the active subtransistors in one of the composite devices to either the first voltage or the second voltage. Each active subtransistor operates in conjunction with a voltage-controlled degeneration subtransistor to form a functional subtransistor pair. Using the nonlinear conductance characteristic of MOS devices operated in the triode region, the transconductance of each functional subtransistor pair is modulated in such a way as to be made relatively insensitive to changes in effective gate-to-source voltage $V_{GS}'$, so that the interpolation circuit produces equally sized interpolated voltage steps at an analog output.

19 Claims, 9 Drawing Sheets